(12) United States Patent
Crevenat et al.

(10) Patent No.: US 12,100,537 B2
(45) Date of Patent: Sep. 24, 2024

(54) DEVICE FOR PROTECTION FROM OVERVOLTAGES

(71) Applicant: CITEL, Sevres (FR)

(72) Inventors: Vincent Crevenat, Reims (FR); Cyril Rousseaux, Amagne (FR)

(73) Assignee: CITEL, Sevres (FR)

( * ) Notice: Subject to any disclaimer, the term of this patent is extended or adjusted under 35 U.S.C. 154(b) by 216 days.

(21) Appl. No.: 17/439,635

(22) PCT Filed: Mar. 19, 2020

(86) PCT No.: PCT/EP2020/057671
§ 371 (c)(1),
(2) Date: Sep. 15, 2021

(87) PCT Pub. No.: WO2020/188052
PCT Pub. Date: Sep. 24, 2020

(65) Prior Publication Data
US 2022/0189666 A1 Jun. 16, 2022

(30) Foreign Application Priority Data
Mar. 20, 2019 (FR) ...................................... 1902872

(51) Int. Cl.
*H01C 7/12* (2006.01)
*H05K 1/18* (2006.01)

(52) U.S. Cl.
CPC .............. *H01C 7/12* (2013.01); *H05K 1/181* (2013.01); *H05K 2201/10196* (2013.01)

(58) Field of Classification Search
CPC . H01C 7/12; H05K 1/181; H05K 2201/10196
(Continued)

(56) References Cited

U.S. PATENT DOCUMENTS 2,777,039 A * 1/1957 Thias ..................... H05K 1/184
338/196
5,280,262 A * 1/1994 Fischer ................ H05K 1/0201
337/402

(Continued)

FOREIGN PATENT DOCUMENTS

CA 2768790 A1 3/2012
CN 107370140 A 11/2017
(Continued)

OTHER PUBLICATIONS

International Search Report for corresponding PCT application No. PCT/EP2020/057671, dated Sep. 24, 2020.
(Continued)

*Primary Examiner* — Anatoly Vortman
(74) *Attorney, Agent, or Firm* — Notaro, Michalos & Zaccaria P.C.

(57) ABSTRACT

An overvoltage protection device having a printed circuit board, a varistor having a metal-oxide varistor body that has a face and a conductive metal layer deposited on the face where the varistor is connected to a first electrical connection terminal by a first connection track of the printed circuit board and a disconnection tab is disclosed. The disconnection tab being fastened directly to the metal layer by a thermofusible link and exerting a traction force on the metal layer so that the disconnection tab moves away from the metal layer and disconnects the electrical connection between the first terminal and the varistor in response to melting of the thermofusible link is also disclosed.

10 Claims, 5 Drawing Sheets

(58) Field of Classification Search
USPC .......................................................... 174/260
See application file for complete search history.

(56) References Cited

U.S. PATENT DOCUMENTS

| | | | | | |
|---|---|---|---|---|---|
| 5,612,662 | A | * | 3/1997 | Drekmeier | H01H 37/761 337/390 |
| 5,896,080 | A | * | 4/1999 | Chen | H05K 1/0201 337/407 |
| 6,430,019 | B1 | * | 8/2002 | Martenson | H01C 7/126 361/103 |
| 7,477,503 | B2 | * | 1/2009 | Aszmus | H01C 7/126 361/111 |
| 7,839,257 | B2 | * | 11/2010 | Cernicka | H01C 7/126 337/79 |
| 8,031,456 | B2 | * | 10/2011 | Wang | H01C 7/126 361/117 |
| 8,836,464 | B2 | * | 9/2014 | Wang | H01T 1/14 337/5 |
| 9,007,163 | B2 | * | 4/2015 | Duval | H01H 37/32 337/401 |
| 9,093,203 | B2 | * | 7/2015 | Depping | H01H 37/36 |
| 9,165,702 | B2 | * | 10/2015 | Hagerty | H01C 7/126 |
| 9,496,112 | B2 | * | 11/2016 | Qin | H01H 89/00 |
| 9,570,260 | B2 | * | 2/2017 | Yang | H01H 61/02 |
| 10,014,098 | B2 | * | 7/2018 | Hirschmann | H01H 37/76 |
| 10,965,121 | B2 | * | 3/2021 | Crevenat | H02H 9/02 |
| 2007/0201177 | A1 | * | 8/2007 | Kladar | H02H 9/042 361/118 |
| 2011/0248816 | A1 | | 10/2011 | Duval et al. | |
| 2012/0068806 | A1 | * | 3/2012 | Guarniere | H01C 7/108 361/91.1 |
| 2017/0330719 | A1 | | 11/2017 | Crevenat et al. | |
| 2018/0062374 | A1 | * | 3/2018 | Yang | H02H 3/025 |
| 2018/0102640 | A1 | * | 4/2018 | Crevenat | H01H 83/10 |
| 2018/0138697 | A1 | | 5/2018 | Crevenat et al. | |
| 2020/0303096 | A1 | | 9/2020 | Crevenat | |

FOREIGN PATENT DOCUMENTS

| | | |
|---|---|---|
| CN | 206790087 U | 12/2017 |
| CN | 108023342 A | 5/2018 |
| CN | 111725793 A | 9/2020 |
| EP | 2008292 A1 | 12/2008 |
| EP | 2026359 A1 | 2/2009 |
| EP | 2375426 A1 | 10/2011 |
| EP | 3244504 A1 | 11/2017 |
| FR | 2551910 A1 | 3/1985 |
| JP | 2000340078 A | 12/2000 |
| JP | 3993256 B2 | 10/2007 |

OTHER PUBLICATIONS

Chinese Office Action for corresponding Chinese application No. 202080029952.X dated Feb. 21, 2024, with machine translation.

* cited by examiner

DEVICE FOR PROTECTION FROM OVERVOLTAGES

TECHNICAL FIELD

The invention relates to the field of integrated overvoltage protection components for electrical appliances.

TECHNOLOGICAL BACKGROUND

In order to protect an electrical appliance, it is common to use a metal-oxide varistor, in particular zinc oxide varistor, connected in series with a gas discharge tube, between the two lines of an AC mains.

In such a device, the gas discharge tube supports virtually the entire AC voltage of the mains. Specifically, the stray capacitance of the discharge tube is a few picofarads, whereas the stray capacitance of the varistor is a few nanofarads. When an overvoltage occurs, it triggers the gas discharge tube, which is able to be extinguished only if the current, called follow-up current, flowing through it subsequently becomes small enough. It is the resistance of the varistor that ensures that the follow-up current is limited and makes it possible to extinguish the gas discharge tube.

There are numerous appliances able to be protected by such a device. For example, electronic appliances, telephone and computer systems, photovoltaic appliances, LED lighting appliances and other appliances.

However, protection devices combining varistors and discharge tubes may be complex and bulky.

JP3993256 discloses an overvoltage protection device comprising a printed circuit board, a positive-temperature-coefficient thermistor element, electrodes placed on either side of the thermistor element, and a disconnection tab that is fastened to one of the electrodes.

SUMMARY

One idea underlying the invention is that of providing a protection device that is simple, unobtrusive and reliable.

To this end, the invention provides an overvoltage protection device having:
 a printed circuit board,
 a varistor having a metal-oxide varistor body that has a face and a conductive metal layer deposited on said face,
wherein the varistor is connected to a first electrical connection terminal by a first connection track of the printed circuit board and a disconnection tab, the disconnection tab being fastened directly to the metal layer by a thermofusible link and exerting a traction force on said metal layer such that the disconnection tab moves away from the metal layer and disconnects the electrical connection between the first terminal and the varistor in response to melting of the thermofusible link.

The protection device is easy to produce by virtue of these features. In particular, the direct connection between the disconnection tab and the metal layer does not require any terminal link in addition to the deposited metal layer or the disconnection tab. In particular, such a device does not require a copper electrode connecting the metal layer and the disconnection tab.

The device is furthermore unobtrusive by virtue of these features. In particular, this protection device does not require space for an electrode connecting the metal layer and the disconnection tab.

In the context of the present document, a conductive metal layer deposited on the metal-oxide varistor body is a coating that is applied to the metal oxide by means of a metal deposition process.

According to some embodiments, such an overvoltage protection device may have one or more of the following features.

According to one embodiment, the varistor has a varistor body made of metal oxide, for example made of zinc oxide.

According to one embodiment, the device furthermore has a gas discharge tube. According to one embodiment, the varistor and the gas discharge tube are connected in series on the printed circuit board.

According to one embodiment, the metal layer or layers are made of silver. According to one embodiment, the metal layer or layers are silver flashes.

According to one embodiment, the metal layer or layers have a thickness of between 8 μm and 16 μm, preferably of between 8 μm and 12 μm, for example 10 μm.

According to one embodiment, the metal layer is deposited through a screen-printing and curing method.

According to one embodiment, the body of the varistor has a cylindrical shape, preferably a rotational shape, but may also have a square, rectangular or even any cross section. According to one embodiment, the first face and the second face of the body of the varistor are parallel and form the ends of the varistor. According to one embodiment, the varistor has a casing made of resin.

According to one embodiment, the thermofusible solder is made from a tin-based alloy that may contain various other metals such as bismuth, silver or copper, the melting temperature being selected by varying the composition of the alloy. According to one embodiment, the alloy that is used to produce the thermofusible link does not contain lead or cadmium. According to one embodiment, the thermofusible solder consists of a "low-temperature" tin alloy whose melting temperature is between 130° C. and 142° C., preferably between 138° C. and 142° C. The thermofusible link may be produced using an alloy provided in the form of a wire, a tab or else a preform, possibly containing a cleaning agent such as a flux cleaner.

According to one embodiment, the metal layer is a first conductive metal layer and the face of the varistor body is a first face of said varistor body and wherein the track of the printed circuit board is a first conductive track of the printed circuit board, the varistor body furthermore having a second metal layer deposited on a second face of the varistor body, said second face being opposite the first face, and wherein the varistor is mounted on the printed circuit board through a direct connection between said second conductive metal layer and a second track of the printed circuit board.

The device is easy to manufacture by virtue of these features. In particular, the direct connection between the second deposited metal layer and the second conductive track does not require any additional component in order to create the connection between the varistor and the second conductive track. Furthermore, such a direct connection between the varistor and the second conductive track has a small bulk, the device therefore also having a small bulk.

According to one embodiment, the disconnection tab is a leaf spring that is prestressed by the thermofusible link between an end of said leaf spring and the conductive metal layer.

By virtue of these features, the thermofusible link between the disconnection tab and the varistor is simple, while at the same time guaranteeing disconnection between the disconnection tab and the varistor when the thermofusible link melts. Specifically, in the operational state, the connection between the disconnection tab and the varistor is created by the thermofusible link and, when said thermofusible link is degraded, the leaf spring makes it possible to space apart the disconnection tab and the varistor without requiring any additional element in order to move said disconnection tab away from the varistor, the leaf spring no longer being prestressed by the thermofusible link moving away from the varistor without external assistance.

According to one embodiment, the prestress force applied to the disconnection tab and maintained by the thermofusible link is between 5 N and 10 N, preferably between 6 N and 7 N, ideally 6.5 N. Such a prestress force is not enough to damage the metal layer, which is relatively thin, while at the same time making it possible to move the disconnection tab and the metal layer apart in the absence of an opposing force, typically when the thermofusible link melts.

According to one embodiment, the disconnection tab consists of a copper alloy.

According to one embodiment, the disconnection tab consists of a copper, beryllium and nickel alloy. Such an alloy makes it possible to achieve optimum conductivity for the disconnection tab as well as satisfactory elasticity so as not to damage the metal layer under the effect of the prestress exerted on said metal layer by the disconnection tab.

According to one embodiment, the disconnection tab has an anchoring portion fastened to the first track, a flexible portion extending between the anchoring portion and the face of the varistor body, and a fastening portion fastened to the metal layer by the thermofusible link.

According to one embodiment, the disconnection tab has an elasticity characterized by a displacement of the fastening portion along a direction perpendicular to the face of the varistor of 4 mm for a force of between 5 N and 10 N, preferably of between 6 N and 7 N and ideally 6.5 N, applied to said fastening portion along said displacement direction.

According to one embodiment, the anchoring portion has a length of between 4 mm and 6 mm, preferably 4.45 mm. According to one embodiment, the flexible portion has a length of between 16 mm and 18 mm, preferably 17.2 mm. According to one embodiment, the fastening portion has a length of between 1.5 mm and 4 mm, preferably 2.68 mm. Said lengths are taken along a longitudinal direction of the disconnection tab. According to one embodiment, the disconnection tab furthermore has a thickness of between 0.3 and 0.6 mm, preferably 0.4 mm. According to one embodiment, the disconnection tab has a width of between 3 and 7 mm, preferably 4 mm.

According to one embodiment, the disconnection tab has a rigidity of between 1250 N/m and 2500 N/m, preferably of between 1500 N/m and 1750 N/m, ideally 1625 N/m.

According to one embodiment, the disconnection tab has a Vickers hardness of between 250 and 310.

According to one embodiment, the disconnection tab has an IACS electrical conductivity greater than or equal to 48%.

The contact surface between the disconnection strip and the first metal layer is determined as a function of the intended lightning current for the overvoltage protection device. According to one embodiment, a contact surface between the disconnection tab and the first metal layer is between 15.5 mm$^2$ and 17.5 mm$^2$, preferably 16.5 mm$^2$.

According to one embodiment, the disconnection strip is coarse. According to one embodiment, the disconnection strip has a surface treatment, for example silvering treatment, tinning treatment or another treatment.

According to one embodiment, the protection device has an electrical resistance greater than or equal to 0.6 mΩ.

According to one embodiment, the overvoltage protection device furthermore has a protective housing arranged around the varistor. According to one embodiment, the housing is arranged around the gas discharge tube.

Such a protective housing makes it possible to protect the components of the protection device, in particular when said device is handled for the purpose of installing it in an electrical circuit.

According to one embodiment, the protective housing has a receptacle forming an internal recess, the varistor being housed in said internal recess, said receptacle having an opening. According to one embodiment, the gas discharge tube is housed in said recess.

According to one embodiment, the printed circuit board forms a cover of the receptacle such that said printed circuit board forms a bottom of the protective housing.

According to one embodiment, the first metal layer is connected to a third connection track of the printed circuit board by a connection tab. According to one embodiment, this third connection track connects the connection tab and a third electrical connection terminal.

According to one embodiment, the printed circuit board has a fourth conductive track connecting the gas discharge tube and the second electrical connection terminal.

According to one embodiment, the printed circuit board has a fifth conductive track connecting the second metal layer of the varistor and a fourth electrical connection terminal.

According to one embodiment, the printed circuit board has a sixth conductive track connecting the second conductive track and a fifth electrical connection terminal.

According to one embodiment, the invention also provides a method for manufacturing an overvoltage protection device comprising:
  providing a printed circuit board comprising a plurality of electrical connection terminals and a plurality of conductive tracks,
  providing a varistor having a metal-oxide varistor body which has a face and a conductive metal layer deposited on said face,
  fastening a disconnection tab to a first track of the printed circuit board, said first track connecting said disconnection tab and a first electrical connection terminal, a tab to be soldered being arranged between the disconnection tab and the first track,
  fastening the varistor to the printed circuit board so that an end of the disconnection tab opposite the first track is located facing and at a distance from the first metal layer of the varistor, a tab to be soldered being arranged between the varistor and the printed circuit board,
  elastically deforming the disconnection tab so as to bring the second end of said disconnection tab into contact with the metal layer, and
  carrying out thermofusible soldering between said end of the disconnection tab and the metal layer.

According to one embodiment, after performing the thermofusible soldering, the method furthermore comprises depositing a varnish on the protection device.

According to one embodiment, the method furthermore comprises:
  heating the device in a furnace so as to solder the printed circuit board and the varistor, on the one hand, and the disconnection tab, on the other hand.

According to one embodiment, the varnish is deposited through spraying, for example by way of a varnish spray or resin spray.

According to one embodiment, heating in the furnace is performed at a temperature greater than or equal to 200° C., for example 270° C.

According to one embodiment, the thermofusible soldering is performed using a thermofusible solder.

According to one embodiment, curing the metal layer or layers deposited on the varistor body comprises a drying phase and a fastening phase. According to one embodiment, the drying phase is performed at a temperature of between 130° C. and 170° C., for example 150° C. According to one embodiment, the drying phase is performed for a duration of between 3 minutes and 20 minutes, for example between 3 minutes and 5 minutes at 150° C. According to one embodiment, the fastening phase is performed at a temperature of between 500° C. and 700° C., preferably 600° C. According to one embodiment, the fastening phase is performed for a duration of between 5 hours and 24 hours.

According to a second subject of the invention, the invention provides an overvoltage protection device comprising:
- a printed circuit board,
- a varistor,
- a gas discharge tube, the varistor and the gas discharge tube being connected in series between a first electrical connection terminal and a second electrical connection terminal of the printed circuit board, wherein:
- the varistor is connected to the first terminal by a first conductive track of the printed circuit board,
- the gas discharge tube is connected to the varistor by a second conductive track of the printed circuit board,
- the gas discharge tube is connected to the second electrical connection terminal by a third connection track of the printed circuit board, and wherein the second track and the third track each have a curved portion, said curved portions being connected to the gas discharge tube and situated on either side of the gas discharge tube, said curved portions each having a concavity facing in one and the same orientation with respect to the gas discharge tube, said curved portions each having a thermofusible area able to separate the corresponding track into two separate parts in response to an overcurrent, the distance between said two separate parts of each track being configured so as to allow the generation of an electrical arc between said two separate parts in response firstly to an overvoltage able to activate the gas discharge tube and secondly to a current and a voltage that keep said gas discharge tube in the conductive state.

By virtue of these features, the second and third tracks form fusible areas able to protect the gas discharge tube, the electrical arc generated in the event of an overvoltage being divided into three series arcs, an electrical arc being generated in the gas discharge tube and in each of the thermofusible areas, thus making it possible to better control said arcs. Furthermore, the thinned portions arranged on curved portions make it possible to orient the electrical arcs generated at said thinned portions such that the electrical arcs generated at said thinned portions are oriented in opposite directions, limiting the risks of interference between said electrical arcs and making it easier to extinguish said arcs in comparison with a single arc.

According to some embodiments, such an overvoltage protection device may have one or more of the following features in addition to the features already indicated above.

According to one embodiment, the first conductive track, the second conductive track and the third conductive track together form an open magnetic field loop between the first electrical terminal and the second electrical terminal in the presence of a current between said first electrical terminal and second electrical terminal. Such a magnetic field loop makes it possible to orient the arcs generated at the thermofusible areas such that said arcs do not interfere with one another.

According to one embodiment, a radius of a circle tangent to the thermofusible area of the second conductive track forms an angle of between 80 and 100°, preferably an angle of 90°, with a radius of a circle tangent to the thermofusible area of the third conductive track. By virtue of these features, the risks of interference between the arcs generated at the thermofusible areas are reduced, and it is made easier to extinguish the arcs.

According to one embodiment, the varistor is connected to a third electrical terminal by a disconnection tab, said disconnection tab being connected to the varistor by a thermofusible link able to disconnect the link between the third electrical terminal and the varistor in response to an increase in the temperature of the varistor beyond a threshold value, said first electrical terminal being intended to be connected to the phase of an electric power supply circuit.

According to one embodiment, the first electrical terminal is intended to be connected to the neutral of an electric power supply circuit and the second electrical terminal is intended to be connected to ground, the gas discharge tube being connected to a fourth electrical terminal by a fourth conductive track, said fourth conductive track being connected to the second conductive track, said fourth electrical terminal being intended to be connected to the neutral of an electrical circuit supplied with power by the electric power supply circuit.

According to one embodiment, the varistor is connected to a fifth electrical terminal by a sixth conductive track, said fifth electrical terminal being intended to be connected to the phase of the electrical circuit supplied with power by the electric power supply circuit.

According to one embodiment, the invention also provides a method for manufacturing an overvoltage protection device comprising:
- providing a printed circuit board comprising a plurality of electrical connection terminals and a plurality of conductive connection tracks,
- providing a varistor,
- providing a gas discharge tube,
- depositing the varistor on the printed circuit board so that the varistor is connected to a first electrical connection terminal by a first conductive track,
- depositing the gas discharge tube on the printed circuit board such that the varistor and the gas discharge tube are connected in series between the first electrical connection terminal and a second electrical connection terminal of the printed circuit board via a second conductive track connecting the varistor and the gas discharge tube and a third conductive track connecting the gas discharge tube to said second electrical connection terminal, the second track and the third track each having a curved portion, said curved portions being connected to the gas discharge tube and situated on either side of the gas discharge tube (22), said curved portions each having a concavity facing in one and the same orientation with respect to the gas discharge tube, said curved portions each having a thermofusible area able to separate the corresponding track into two separate parts in response to an overcurrent, the distance between said two separate parts of said tracks being configured so as to allow the generation of an electrical arc between said two separate parts in response firstly to an overvoltage able to activate the gas discharge tube and secondly to a current and a voltage that keep said gas discharge tube in the conductive state.

According to one embodiment, in such a manufacturing method, the varistor has a varistor body made of metal oxide, having a face and a conductive metal layer deposited on said face.

According to one embodiment, such a manufacturing method may furthermore comprise, in addition to the features indicated above:
- depositing a disconnection tab on a fourth track of the printed circuit board, said fourth track connecting said disconnection tab and a third electrical connection terminal, the step of depositing the varistor on the printed circuit board is performed such that the end of the disconnection tab opposite the first track faces and is spaced from the metal layer of the varistor,
- elastically deforming the disconnection tab so as to bring the second end of said disconnection tab into contact with the metal layer, and
- carrying out thermofusible soldering between said end of the disconnection tab and the metal layer.

BRIEF DESCRIPTION OF THE FIGURES

The invention will be understood better and further aims, details, features and advantages thereof will become more clearly apparent from the following description of a number of particular embodiments of the invention, which are given solely by way of illustration and without limitation, with reference to the appended drawings.

DESCRIPTION OF THE EMBODIMENTS

Figure 1:
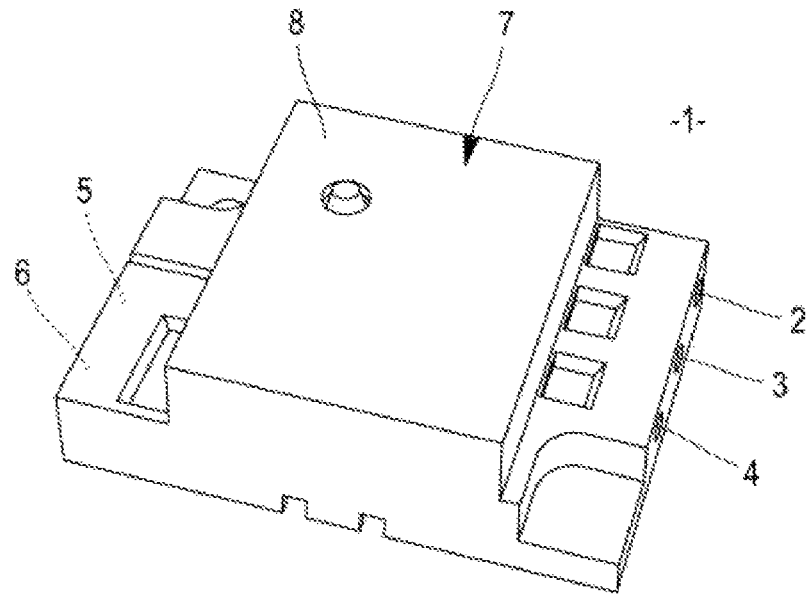
FIG. 1 is a schematic perspective view of an overvoltage protection device.

An overvoltage protection device, hereinafter device 1, as illustrated in FIGS. 1 to 7 is intended to be integrated into an electrical circuit in order to protect one or more electrical apparatuses of said electrical circuit from overvoltages. Such electrical apparatuses are for example LED lighting devices or other devices. The device 1 thus has conductive terminals that are intended to receive cables of the electrical circuit. In FIG. 1, the device 1 has a first conductive terminal 2 intended to be connected to the phase, a second conductive terminal 3 intended to be connected to neutral and a third conductive terminal 4 intended to be connected to ground. This device 1 furthermore has a fourth conductive terminal 5 and a fifth conductive terminal 6 that are intended to connect the device 1 to the electrical circuit (not shown).

This device 1 has a housing 7 in which the various components of said device 1 are housed. The conductive terminals 2 to 6 emerge from the housing 7 in order to allow them to be connected to the power supply circuit or the electrical circuit to be supplied with power. This housing 7 has a receptacle 8 forming an internal recess in which the various components of the device 1 are housed.

Figure 2:
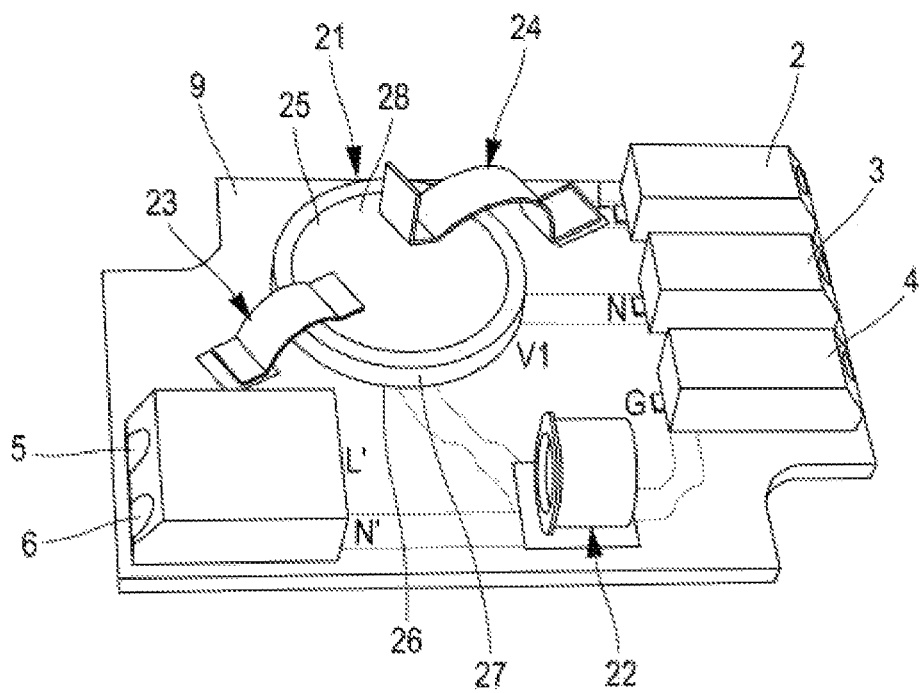
FIG. 2 is a schematic perspective view of the printed circuit board and of the components mounted on said printed circuit board of the overvoltage protection device of FIG. 1.

As illustrated in FIG. 2, the device 1 has a printed circuit board 9. Advantageously, this printed circuit board 9 forms a cover of the housing 7 and interacts with the receptacle 8 so as to close the housing 7 while housing the various components of the device 1 in the internal recess.

Figure 5:
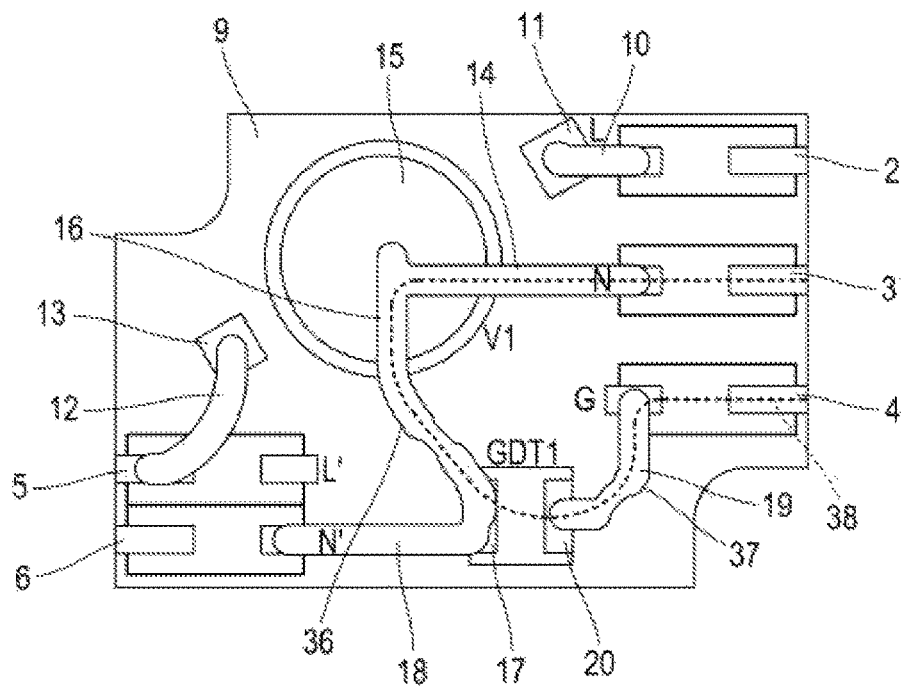
FIG. 5 is a plan view of the printed circuit board of FIG. 2 in which the components mounted on said printed circuit board are omitted, and illustrating the magnetic forces generated by a current flowing through the gas discharge tube.
Figure 6:
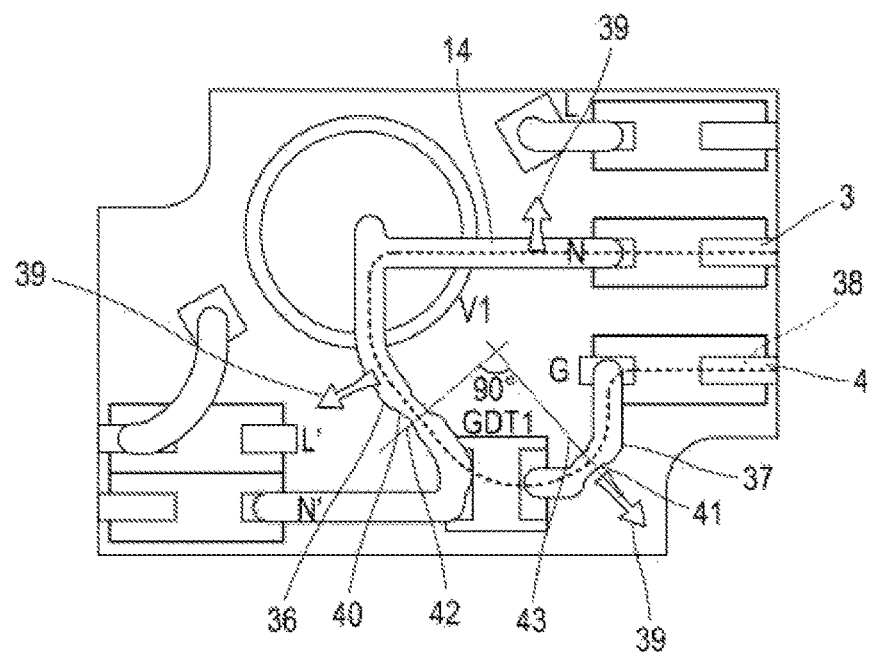
FIG. 6 is a plan view of the printed circuit board of FIG. 2 in which the components mounted on said printed circuit board are omitted, and illustrating the areas where arcs are generated in the presence of an overvoltage.

The printed circuit board 9 has a plurality of conductive tracks allowing the various components of the device 1 to be electrically connected to one another and to the conductive terminals 2 to 6. More particularly, for example as illustrated in FIG. 5, the printed circuit board 9 has a first conductive track 10 electrically connecting the first electrical terminal 2 to a first connection area 11. A second conductive track 12 of the printed circuit board 9 connects a second connection area 13 to the fourth electrical terminal 5. A third conductive track 14 connects a third connection area 15 to the third electrical terminal 3. This third connection area 15 is also connected to a fourth connection area 17 via a fourth conductive track 16. A fifth conductive track 18 connects said fourth connection area 17 to the fifth conductive terminal 6. Lastly, a sixth conductive track 19 connects a fifth connection area 20 to the third electrical terminal 4.

As illustrated in FIG. 2, the device 1 furthermore has a varistor 21, a gas discharge tube 22, a connection tab 23 and a disconnection tab 24.

The varistor 21 has a body 51 made of metal oxide, for example a varistor body made of zinc oxide. The body 51 of the varistor has a first face 25 and a second face 26 that are flat and parallel. The body 51 of the varistor 21 has a rotational cylindrical shape, the first face 25 and the second face 26 having circular shapes. A lateral face 27 of the body 51 of the varistor 21 is preferably coated with an epoxy resin.

The first face 25 is coated with a first metal layer 28 made of conductive material. This first metal layer 28 is for example a silver flash deposited on the first face 25 by way of a screen-printing deposition method. Such a first metal layer 28 is for example dried by passing through a furnace. Such passing through the furnace is performed for example at a temperature of between 130° C. and 170° C. for a few minutes. For example, passing through the furnace involves exposing the first metal layer 28 to a temperature of 150° C. for at least 3 to 5 minutes. The first metal layer is then fastened during curing at a temperature of between 500° C. and 700° C., for example 600° C., for a duration of between 5 hours and 24 hours. Such a first deposited metal layer 28 has a low thickness in comparison with the thickness of the varistor 21, for example of the order of 8 μm to 16 μm, preferably of between 8 μm and 12 μm, ideally 10 μm.

In the same way, the second face 26 of the body 51 of the varistor 21 is also coated with a second deposited metal layer, for example made of silver. This second metal layer is produced in the same way as the first metal layer 28, through a screen-printing deposition method followed by a drying step and a fastening step.

The varistor 21 is mounted directly on the printed circuit board 9. More particularly, the second metal layer deposited on the second face 26 of the body 51 of the varistor 21 is mounted directly on the printed circuit board 9 in the third connection area 15. In other words, the second metal layer deposited on the second face 26 of the body 51 of the varistor is connected directly in said third connection area 15 to the third conductive track 14 and to the fourth conductive track 16. Said third conductive track 15 thus connects the varistor 21 directly to the second electrical terminal 3.

Moreover, the varistor 21 is also connected to the first connection area 11 and to the second connection area 13. More particularly, the disconnection tab 24 has a first end mounted in the first connection area 11, and therefore electrically connected to the first conductive track 10, and a second end mounted on the first metal layer 28 as is explained in more detail below with reference to FIGS. 3 and 4. The connection tab 23 furthermore has a first end 29 mounted in the second connection area 13, and therefore connected to the second conductive track 12, and a second end 30 mounted on the first metal layer 28.

The gas discharge tube 22 is for its part mounted on the printed circuit board 9 in the fourth connection area 17 and in the fifth connection area 20. Typically, a first terminal of said gas discharge tube 22 is connected to the fourth connection area 17, that is to say to the fourth conductive track 16 and to the fifth conductive track 18, and a second terminal of said gas discharge tube 22 is connected to the fifth connection area 20 and therefore to the sixth conductive track 19. The first terminal of the gas discharge tube 22 is thus electrically connected firstly to the varistor 21 via the fourth conductive track 16 and secondly to the fifth electrical terminal 6 via the fifth conductive track 18. The second terminal of the gas discharge tube 22 is furthermore connected to the third electrical terminal 4 via the sixth conductive track 19.

The printed circuit board 9 thus serves at the same time as a support for the varistor 21, the gas discharge tube 22, the connection tab 23 and the disconnection tab 24, as a connection between the components by virtue of the conductive tracks 10, 12, 14, 16, 18, 19, and as a bottom of the housing 7.

Figure 3:
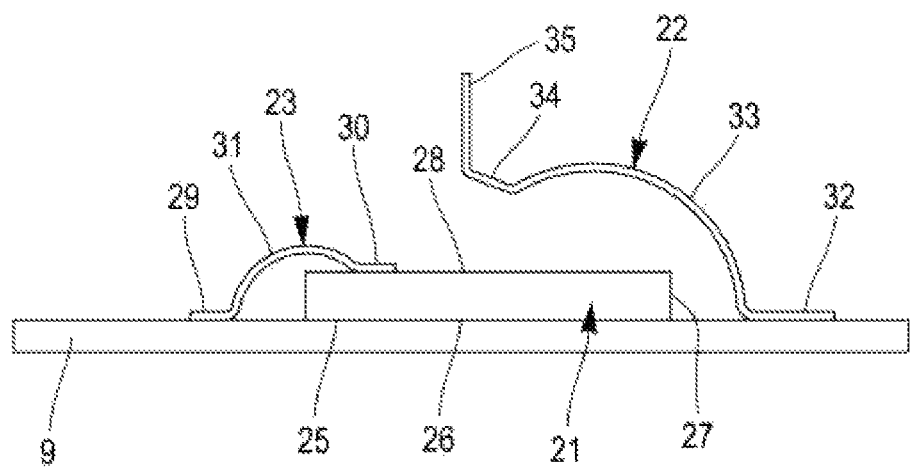
FIG. 3 is a sectional view of FIG. 2 at the varistor.
Figure 4:
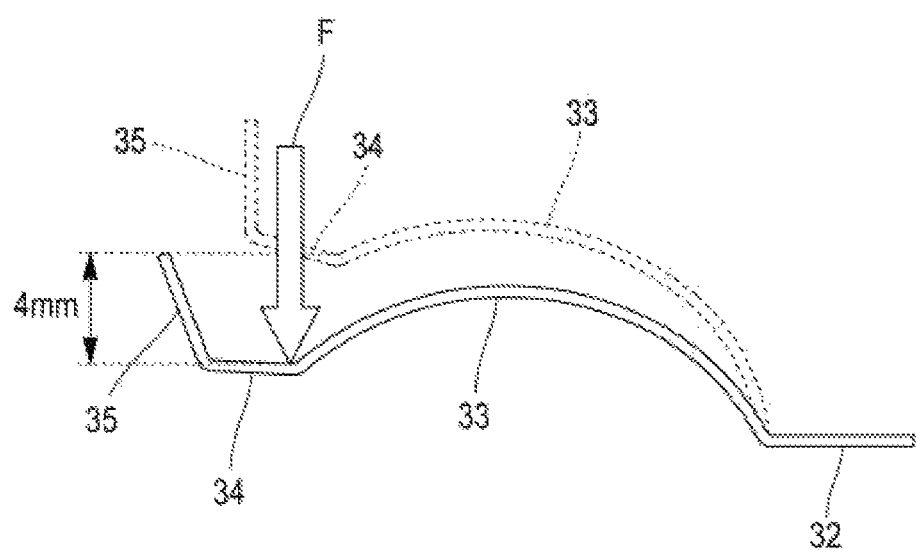
FIG. 4 is a sectional view of the disconnection tab of FIG. 3.

The link between the printed circuit board 9 and the varistor 21 is described below with reference to FIGS. 3 and 4.

The first end 29 of the connection tab 23 is flat so as to be able to be fastened to the printed circuit board 9 in the second connection area 13, that is to say in contact with the second conductive track 12. Likewise, the second end 30 of said connection tab 23 is flat so as to be able to be fastened to the first metal layer 28. The connection tab has a curved central portion 31 connecting the first end 29 and the second end 30. This central portion 31 is rigid and designed so as not to exert stress on the printed circuit board 9 and/or on the first metal layer 28.

The disconnection tab 24 is in the form of a leaf spring. This disconnection tab 24 is for example made from copper alloy. The disconnection tab 24 is for example made from a copper, beryllium and nickel alloy, such an alloy making it possible to achieve good conductivity and good elasticity.

In succession along a longitudinal direction of the disconnection tab 24, said disconnection tab 24 has an anchoring portion 32, a flexible portion 33, a fastening portion 34 and a return 35. In the same way as the ends 29 and 30 of the connection tab 23, the anchoring portion 32 of the disconnection tab 24 is flat so as to be able to be fastened to the printed circuit board 9 in the first connection area 11 that is electrically connected to the first conductive track 10.

The fastening portion 34 is fastened directly to the first metal layer 28, that is to say that the first metal layer 28 performs the function of a connection electrode of the varistor 21. The fastening portion 34 is flat so as to be able to ensure stable fastening on said fastening portion 34 to the first metal layer 28. The contact surface between the fastening portion and the first metal layer is determined as a function of the intended lightning current for the device 1. The fastening portion 34 has for example a contact surface of between 5 mm$^2$ and 17.5 mm$^2$, for example 9 mm$^2$ or 16.5 mm$^2$, with the first metal layer 28. This link between the fastening portion 34 and the first metal layer 28 is created by way of a thermofusible link 52, that is to say a link able to degrade in response to a temperature exceeding a threshold value, for example a threshold temperature of between 130° C. and 142° C., preferably between 138° C. and 142° C. This thermofusible link 52 is formed by any appropriate means, for example low-temperature soldering. This thermofusible solder may be produced with the addition of material, such as for example tin or another material. This addition of material is for example a tin alloy without lead or cadmium in the form of a wire, soldering tab 53 or preform associated with a cleaning agent such as soldering flux.

The flexible portion 33 that connects the anchoring portion 32 and the fastening portion 34 is curved and elastic. This flexible portion 33 makes it possible to move the fastening portion 34 away from the first metal layer 28 when the thermofusible link 52 degrades. In order to ensure this moving apart of the fastening portion 34 and the first metal layer 28 when the thermofusible link 52 degrades, the disconnection tab 24 is prestressed. However, as the first metal layer 28 is relatively thin, of the order of a few μm, for example between 8 μm and 16 μm, preferably between 8 μm and 12 μm, for example 10 μm, the flexible portion 33 has to have elastic characteristics such that this prestress is not excessively great. Specifically, an excessively great prestress could tear away the first metal layer 28 deposited on the body 51 of the varistor 21 and therefore damage the varistor 21. However, the flexible portion 33 has to have enough elasticity to satisfactorily move the fastening portion 34 apart from the first metal layer 28 when the thermofusible link 52 degrades.

In one exemplary embodiment, the flexible portion 33 has for example a length of between 16 mm and 18 mm, preferably 17.2 mm, a width of between 3 and 7 mm, preferably 4 mm, and a thickness of between 0.3 and 0.6 mm, preferably 0.4 mm. In this example, as illustrated in FIG. 4, the flexible portion 33 has an elasticity such that a force F of between 5 N and 10 N, preferably 6.5 N, applied to the junction between the flexible portion 33 and the fastening portion 34 and along a direction perpendicular to the plane of the anchoring portion 32, brings about a displacement of 4 mm at said junction.

In order to achieve the elasticity characteristics of the flexible portion, the disconnection tab 24 may be subjected to various treatments, such as for example to a tempering heat treatment intended to give it these desired mechanical characteristics. The disconnection strip 24 may for example be coarse or surface-treated, for example through silvering or tinning. The disconnection strip 24 has a rigidity of between 1250 N/M and 2500 N/M, preferably of between 1500 N/M and 1750 N/M, ideally 1650 N/M. The disconnection strip preferably has a Vickers hardness of between 250 and 310.

With reference to FIG. 5, it is observed that the fourth conductive track 16 has a first curved portion 36. Likewise, the sixth conductive track 19 has a second curved portion 37. The first curved portion 36 and the second curved portion 37 have a centre of curvature situated on one and the same side of said conductive tracks 16 and 19. In other words, the first curved portion and the second curved portion have respective concavities facing one another. Thus, as illustrated in FIG. 5, the link between the second electrical terminal 3 and the third electrical terminal 4 is substantially in the shape of an open loop 38 between said electrical terminals 3 and 4, this open loop 38 being illustrated schematically in FIGS. 5 and 6 in dotted lines. This open loop 38 passes through the third conductive track 14, the fourth conductive track 16 and the sixth conductive track 19 via the gas discharge tube 22 (not illustrated in FIGS. 5 and 6). Thus, in the presence of an electric current flowing through this open loop 38, magnetic forces are generated towards the outside of this loop, as illustrated by the arrows 39 in FIG. 6.

The first curved portion 36 has a first thinned track portion 40. Likewise, the second curved portion 37 has a second thinned track portion 41. These thinned portions 40 and 41 form fusible areas that degrade in the presence of an overcurrent. More particularly, as explained below, an overcurrent flowing through these thinned track portions 40 and 41 causes them to melt, thereby interrupting the corresponding conductive track at said thinned track portion, achieving the function of a fusible area.

Preferably, a tangent to the first curved portion 36 at the first thinned portion 40, preferably taken in the middle of said first thinned portion 40, is perpendicular to a tangent to the second curved portion 37 at the second thinned portion 41, preferably taken in the middle of said second thinned portion 41. In other words, a circle tangent to the middle of the first thinned portion 40 has a radius forming an angle of between 80° and 100°, preferably 90°, as illustrated in the figures, with the radius of a circle tangent to the middle of the second thinned portion 41. Such perpendicular radii are illustrated for example in FIG. 6 with the references 42 for the first curved portion 36 and 43 for the second curved portion 37.

During normal operation of the electrical circuit, the current flows between the first electrical terminal 2 and the fourth electrical terminal 5 via the first conductive track 10, the disconnection tab 24, the first metal layer 28, the connection tab 23 and the second conductive track 12. Moreover, during normal operation of the electrical circuit, the current also flows between the fifth electrical terminal 6 and the second electrical terminal 3 via the fifth conductive track 18, the fourth conductive track 16 and the third conductive track 14.

The varistor 21 and the gas discharge tube 22 make it possible to protect the electrical circuit in the presence of an overvoltage.

Figure 7:
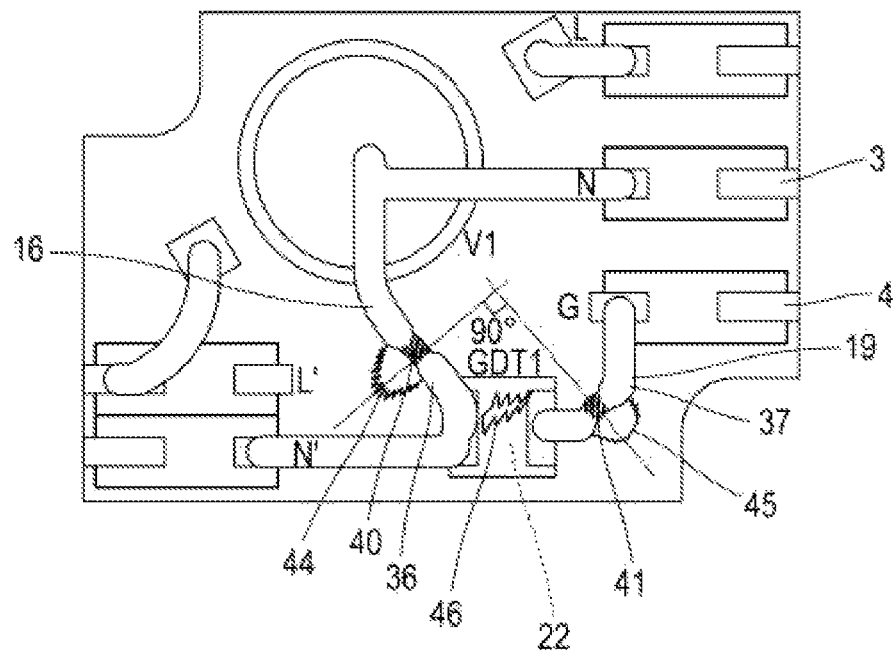
FIG. 7 is a plan view of the printed circuit board of FIG. 2 in which the components mounted on said printed circuit board are omitted, and illustrating the orientation of the arcs that are generated in the presence of an overvoltage.
Figure 8:
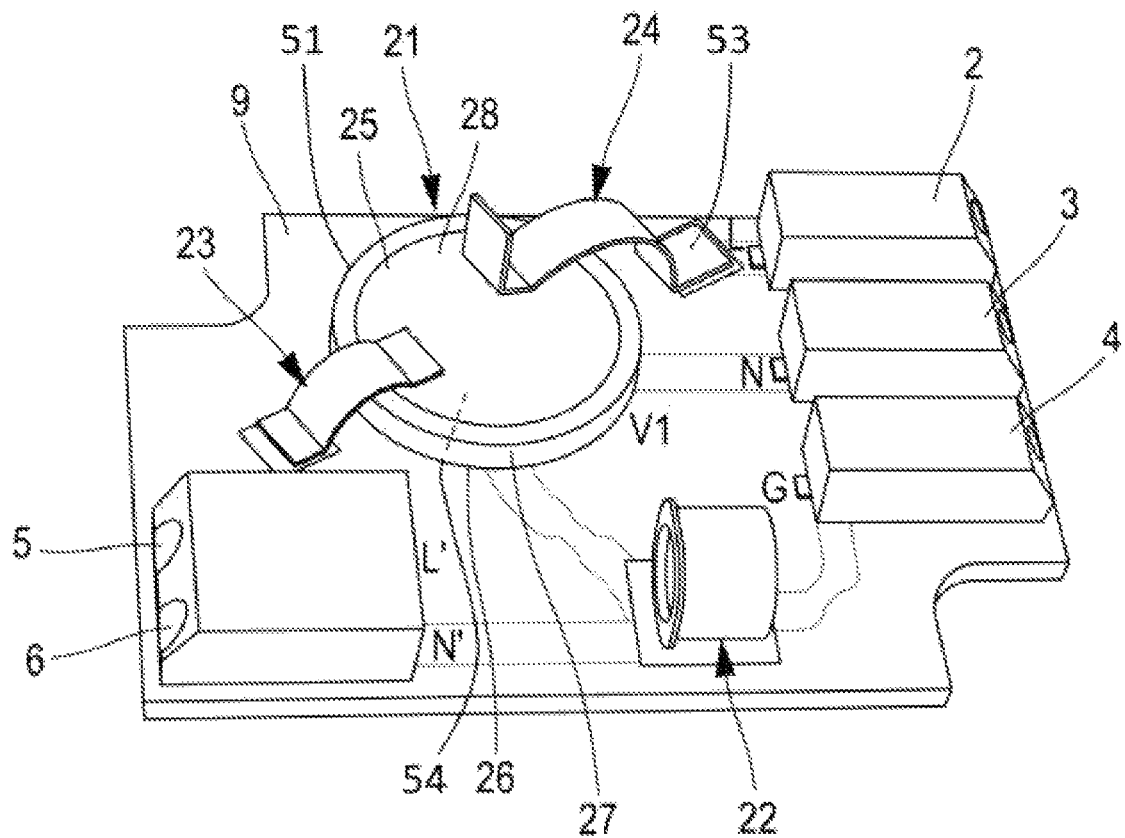
FIG. 8 reproduces FIG. 2, in which the varistor body 51, the first soldering tab 53 and the second soldering tab 54 are illustrated.
Figure 9:
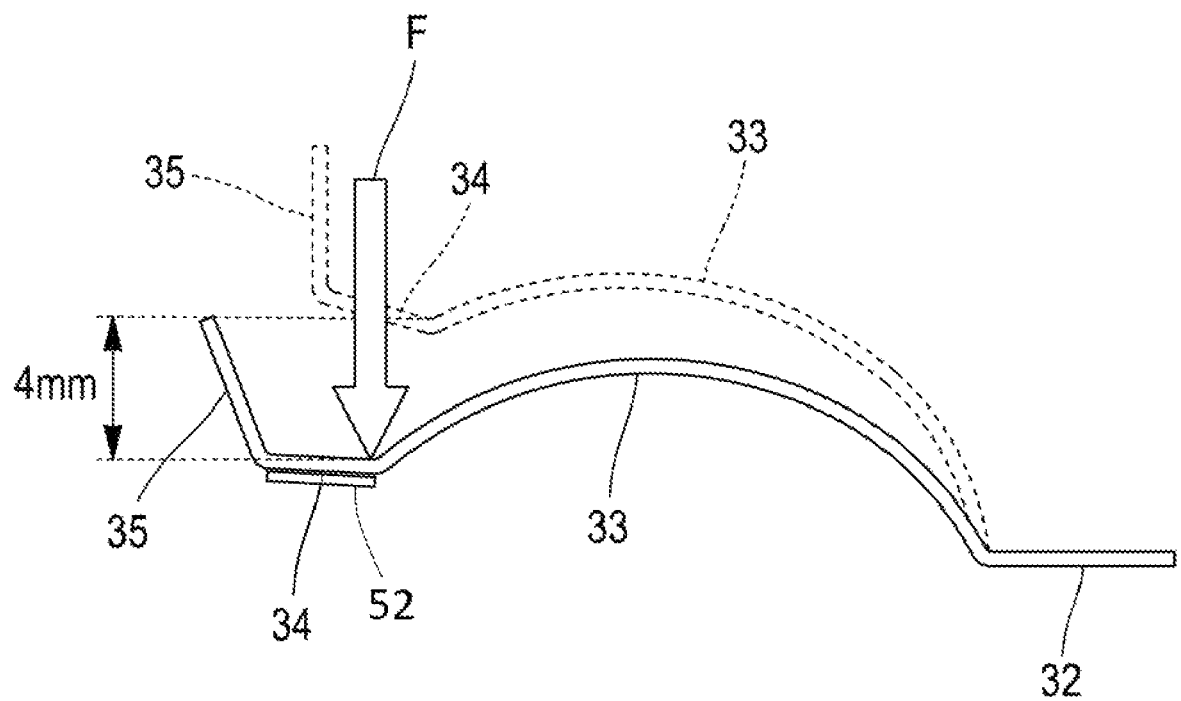
FIG. 9 reproduces FIG. 4, in which the thermofusible link 52 is illustrated.

In the presence of an overvoltage, an electrical arc 46 illustrated in FIG. 7 is generated in the gas discharge tube 22, thus connecting the electrical circuit and the third electrical terminal 3, typically the electrical terminal intended to be connected to ground.

The first thinned portion 40 melts under the effect of the overcurrent, the fourth conductive track 16 thus being interrupted at said first thinned portion 40 that has melted. Likewise, the second thinned portion 41 melts under the effect of the overcurrent, the sixth conductive track 19 thus being interrupted at said second thinned portion 41 that has melted. The length of the first thinned portion 40 is calibrated such that, after said first thinned portion 40 has melted, an electrical arc 44 is generated and maintained through the presence of current and of a flow of current between the parts of the fourth conductive track 16 that have been separated by said first thinned portion 40 that has melted. In the same way, the length of the second thinned portion 41 is such that an overcurrent causes the second thinned portion to melt and that an electrical arc 45 between the parts of the sixth conductive track 19 that were separated when the second thinned portion 41 melted is able to be maintained by the presence of a current and a flow of current.

In other words, in the presence of an overcurrent, the first thinned portion 40 and the second thinned portion 41 make it possible to divide the electrical arc normally generated in the gas discharge tube 22 into three series electrical arcs, a first arc 44 being located on the fourth conductive track 16, a second arc 46 being located in the gas discharge tube 22 and a third arc 45 being located on the sixth conductive track 19. This division into a plurality of electrical arcs 44, 45 and 46 offers a better ability to interrupt these arcs.

Moreover, the fact that the thinned portions 40 and 41 are located on curved portions whose radii of curvature are situated on one and the same side advantageously makes it possible to orient the arcs 44 and 45. As explained above, the curvature of the tracks 36 and 37 makes it possible to form the open loop 38. The arcs 44 and 45 generated on the curved portions 36 and 37 of such an open loop 38, typically at the thinned portions 40 and 41, are generated towards the outside of this open loop 38. As a result, as illustrated in FIG. 7, the arcs 44 and 45 generated at the thinned portions 40 and 41 are therefore oriented towards the outside of the open loop 38, and therefore in opposite directions, thus preventing these arcs 44 and 45 from interfering with one another and from coming into contact with one another. This orientation of the arcs 44 and 45 due to the curved portions 36 and 37 thus ensures that the thinned portions 40 and 41 effectively protect the gas discharge tube 22 by dividing the arc maintained by the current and the flow of current into three arcs 44, 45 and 46, two of said separate arcs being situated on either side of said gas discharge tube 22.

Moreover, in the presence of an overcurrent, the thermofusible link 52 between the disconnection tab 24 and the first metal layer 28 of the varistor 21 melts. From then on, the first metal layer 28 no longer exerts a retaining force, on the fastening portion 34 via the thermofusible link 52, that opposes the force exerted on said fastening portion 34 by the flexible portion 33. The flexible portion 33, in the absence of an opposing force, moves the fastening portion 34 elastically away from the first metal layer 28, thus disconnecting the connection between said disconnection tab 24 and the varistor 21.

The method for manufacturing the overvoltage protection device is described below. In a first step, the paste to be soldered is deposited on the printed circuit board 9. In a second step, the components, that is to say the varistor 21, the gas discharge tube 22, the connection tab 23 and the disconnection tab 24, are deposited on the printed circuit board 9. The assembly thus formed is passed through the furnace in a third step. This passing through the furnace is performed for example at a temperature greater than 200° C., for example 270° C., and makes it possible to perform all of the soldering operations in a single step, other than the thermofusible link between the disconnection tab 24 and the varistor 21. In a fourth step, low-temperature soldering, for example between 130° C. and 142° C., is used to form the thermofusible link between the disconnection tab 24 and the first metal layer 28 of the varistor 21. This low-temperature soldering is for example performed with the addition of a tin-bismuth alloy in the form of a wire, tab or preform. The assembly thus formed is then tropicalized using a varnish spray or resin spray.

Although the invention has been described in connection with a number of particular embodiments, it is obvious that it is in no way limited thereby and that it comprises all the technical equivalents of the means described and the combinations thereof where these fall within the scope of the invention.

The use of the verb "have", "comprise" or "include" and of the conjugated forms thereof does not exclude the presence of elements or steps other than those set out in a claim.

In the claims, any reference sign between parentheses should not be interpreted as limiting the claim.

The invention claimed is:

1. An overvoltage protection device comprising:
   a printed circuit board,
   a varistor having a metal-oxide varistor body that has a face and a conductive metal layer deposited by a screen-printing and curing method on said face,
   wherein the varistor is connected to a first electrical connection terminal by a first connection track of the printed circuit board and a disconnection tab, the disconnection tab being fastened directly to the conductive metal layer by a thermofusible link and exerting a traction force on said metal layer such that the disconnection tab moves away from the conductive metal layer and disconnects the electrical connection between the first electrical connection terminal and the varistor in response to melting of the thermofusible link,
   wherein the conductive metal layer has a thickness of between 8 µm and 16 µm,
   wherein the disconnection tab is a leaf spring that is prestressed by the thermofusible link between an end of said leaf spring and the conductive metal layer, and
   wherein the prestressing force applied to the disconnection tab and maintained by the thermofusible link is between 5 N and 10 N.

2. The overvoltage protection device as claimed in claim 1, wherein the conductive metal layer is made of silver.

3. The overvoltage protection device as claimed in claim 1, wherein the conductive metal layer is a first conductive metal layer and the face of the metal-oxide varistor body is a first face of said metal-oxide varistor body, the metal-oxide varistor body furthermore comprising a second conductive metal layer deposited on a second face of the metal-oxide varistor body, said second face being opposite the first face, and wherein the varistor is mounted on the printed circuit board through a direct connection between said second conductive metal layer and a second track of the printed circuit board.

4. The overvoltage protection device as claimed in claim 1, wherein the disconnection tab is made of a copper alloy.

5. The overvoltage protection device as claimed in claim 1, wherein the disconnection tab has an anchoring portion fastened to the first connection track, a flexible portion extending between the anchoring portion and the face of the metal-oxide varistor body, and a fastening portion fastened to the conductive metal layer by the thermofusible link.

6. The overvoltage protection device as claimed in claim 1, wherein the disconnection tab has an electrical conductivity greater than or equal to 27.84 MS/m, readings at 20° C.

7. The overvoltage protection device as claimed in claim 1, further comprising a protective housing arranged around the varistor.

8. The overvoltage protection device as claimed in claim 1, wherein the disconnection tab comprises a return located in succession of a fastening portion along a longitudinal direction of the disconnection tab, wherein the fastening portion is flat so as to be able to ensure stable fastening, the fastening portion has a contact surface of between 5 mm$^2$ and 17.5 mm$^2$.

9. A method for manufacturing an overvoltage protection device, comprising:
   providing a printed circuit board comprising a plurality of electrical connection terminals and a plurality of conductive tracks,
   providing a varistor having a metal-oxide varistor body which has a face and a conductive metal layer deposited on said face by a screen-printing and curing method,
   fastening a disconnection tab to a first connection track of the printed circuit board, said first connection track connecting said disconnection tab and a first electrical connection terminal, a first soldering tab to be soldered being arranged between the disconnection tab and the first connection track,
   fastening the varistor to the printed circuit board so that a first end of the disconnection tab opposite the first connection track is located facing and at a distance from the conductive metal layer of the varistor, a second soldering tab to be soldered being arranged between the varistor and the printed circuit board,
   elastically deforming the disconnection tab so as to bring a second end of said disconnection tab into contact with the conductive metal layer, and
   carrying out thermofusible soldering between said end of the disconnection tab and the conductive metal layer,
   wherein the conductive metal layer has a thickness of between 8 µm and 16 µm,
   wherein the disconnection tab is a leaf spring that is prestressed by the thermofusible link between an end of said leaf spring and the conductive metal layer, and
   wherein the prestressing force applied to the disconnection tab and maintained by the thermofusible link is between 5 N and 10 N.

10. An overvoltage protection device comprising:
    a printed circuit board,
    a varistor having a metal-oxide varistor body that has a face and a conductive metal layer deposited on said face,
    wherein the varistor is connected to a first electrical connection terminal by a first connection track of the printed circuit board and a disconnection tab, the disconnection tab comprises in succession along a longitudinal direction of said disconnection tab: an anchoring portion fastened to the first connection track, a flexible portion, a fastening portion and a return, the fastening portion of the disconnection tab being fastened directly to the conductive metal layer by a thermofusible link and exerting a traction force on said metal layer such that the disconnection tab moves away from the conductive metal layer and disconnects the electrical connection between the first electrical connection terminal and the varistor in response to melting of the thermofusible link, the flexible portion connects the anchoring portion and the fastening portion, wherein the conductive metal layer has a thickness of between 8 μm and 16 μm, wherein the disconnection tab is a leaf spring that is prestressed by the thermofusible link between the fastening portion of said leaf spring and the conductive metal layer, and wherein the prestressing force applied to the disconnection tab and maintained by the thermofusible link is between 5 N and 10 N.

* * * * *